(12) United States Patent
Konishi

(10) Patent No.: US 10,121,719 B2
(45) Date of Patent: Nov. 6, 2018

(54) SEMICONDUCTOR DEVICE

(71) Applicant: Mitsubishi Electric Corporation, Tokyo (JP)

(72) Inventor: Yasuo Konishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/456,755

(22) Filed: Mar. 13, 2017

(65) Prior Publication Data

US 2018/0019181 A1    Jan. 18, 2018

(30) Foreign Application Priority Data

Jul. 15, 2016 (JP) .................................. 2016-140001

(51) Int. Cl.
| | |
|---|---|
| *H01L 23/367* | (2006.01) |
| *H01L 23/49* | (2006.01) |
| *H01L 23/00* | (2006.01) |

(52) U.S. Cl.
CPC .......... *H01L 23/3675* (2013.01); *H01L 23/49* (2013.01); *H01L 24/48* (2013.01)

(58) Field of Classification Search
None
See application file for complete search history.

(56) References Cited

U.S. PATENT DOCUMENTS

| | | | | |
|---|---|---|---|---|
| 5,539,250 A | * | 7/1996 | Kitano ................ | H01L 23/3135 257/666 |
| 6,914,321 B2 | * | 7/2005 | Shinohara .......... | H01L 23/4334 257/502 |
| 9,768,035 B2 | * | 9/2017 | Guth ................... | H01L 21/4817 |
| 2012/0044637 A1 | * | 2/2012 | Rothkopf ............. | G06F 1/1626 361/679.55 |
| 2014/0239484 A1 | * | 8/2014 | Matsuda ............. | H01L 23/3736 257/712 |

FOREIGN PATENT DOCUMENTS

| | | | |
|---|---|---|---|
| JP | 2010-045399 A | 2/2010 | |
| JP | 2010045399 A1 * | 2/2010 | ............. H01L 23/36 |

OTHER PUBLICATIONS

PCT/JP2015/002284.*

* cited by examiner

*Primary Examiner* — Kyoung Lee
*Assistant Examiner* — Christina Sylvia
(74) *Attorney, Agent, or Firm* — Studebaker & Brackett PC

(57) ABSTRACT

Provided is a technique for enhancing heat dissipation properties in dissipating heat generated in an electrode to a heatsink without impairing bonding properties between the electrode and a wire. In a semiconductor device, a portion of an electrode within an inner region defined by a case, at one surface, i.e., the lower surface with respect to a position in which a wire is connected, a resin portion is provided, the resin portion extending from an inner wall of the case to an upper-surface side of the heatsink. Additionally, in the portion of the electrode within the inner region defined by the case, at one surface, i.e., the lower surface with respect to a position in which the wire is not connected, a thermal conductor is provided, the thermal conductor having higher heat conductivity than the resin portion.

5 Claims, 4 Drawing Sheets

F I G . 8
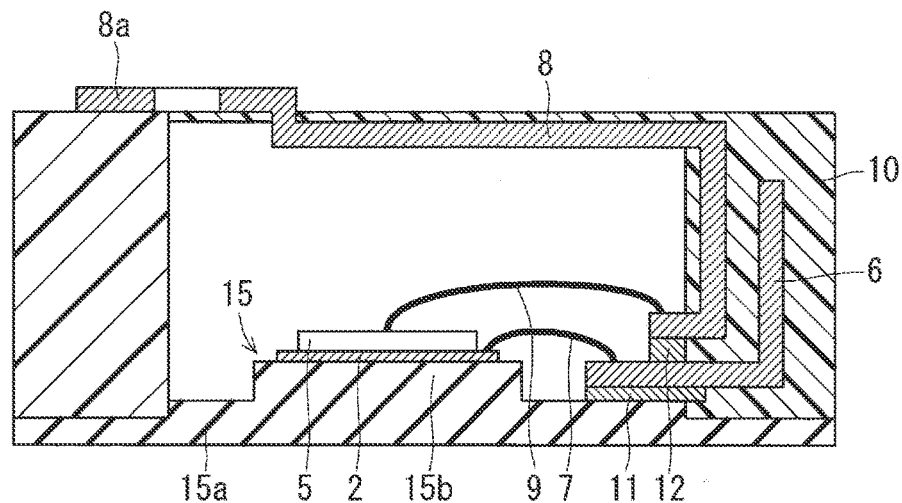
F I G . 9
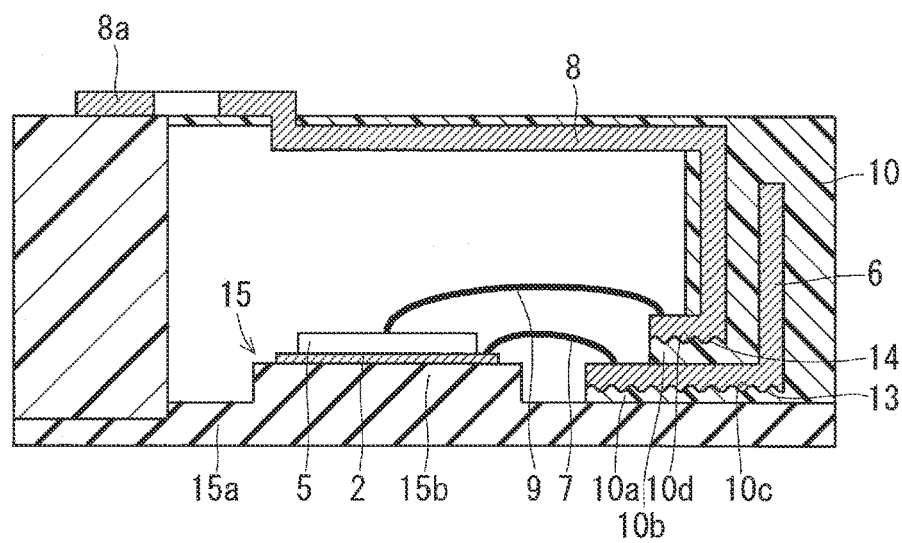

SEMICONDUCTOR DEVICE

BACKGROUND OF THE INVENTION

Field of the Invention

The present invention relates to semiconductor devices.

Description of the Background Art

Semiconductor devices have been used in various fields ranging from generation and transmission of electric power to efficient use and reproduction of energy. Such a semiconductor device includes an insulating substrate having a current circuit pattern on a heatsink, and includes a semiconductor element such as a current-switching element on the current circuit pattern. The current circuit pattern is connected to, through wires, one of electrodes, including a terminal for electrical connection with the outside. Further, the semiconductor element is connected to the other electrode though a wire. These electrodes are included in a resin case. Additionally, heat conductors are disposed between the heatsink and the one of the electrodes, and between the two electrodes (e.g., see Japanese Patent Application Laid-Open No. 2010-45399).

Japanese Patent Application Laid-Open No. 2010-45399 describes a structure that enhances heat dissipation properties using a heat conductor in dissipating heat generated in electrodes to a heatsink. Unfortunately, if the rigidness of the heat conductor, which is indicated by a Young's modulus and a modulus of lateral elasticity, is lower than that of a case, vibrations do not propagate to the electrodes successfully in ultrasonic bonding of wires, thus resulting in impairment of bonding properties between the electrodes and the wires.

SUMMARY OF THE INVENTION

It is an object of the present invention to provide a technique for enhancing heat dissipation properties in dissipating heat generated in an electrode to a heatsink without impairing bonding properties between the electrode and a wire.

The semiconductor device according to an aspect of the present invention includes a heatsink, an insulating substrate, a semiconductor element, a resin case, and an electrode. The insulating substrate is disposed above the heatsink. The semiconductor element is disposed above the insulating substrate. The resin case encloses an upper-surface side of the case, the insulating substrate, and the semiconductor element. The electrode includes a portion within an inner region defined by the case, and is electrically connected to the semiconductor element at one surface of the portion through a wire. In the portion of the electrode within the inner region defined by the case, at another surface with respect to a position in which the wire is connected, a resin portion is provided, the resin portion extending from an inner wall of the case to the upper-surface side of the heatsink. In the portion of the electrode within the inner region defined by the case, at another surface with respect to a position in which the wire is not connected, a heat conductor is provided, the heat conductor having higher thermal conductivity than the resin portion.

In the portion of the electrode within the inner region defined by the case, at the other surface with respect to the position in which the wire is connected, the resin portion is provided, the resin portion extending from the inner wall of the case to the upper-surface side of the heatsink. Additionally, in the portion of the electrode within the inner region defined by the case, at the other surface with respect to the position in which the wire is not connected, the heat conductor having the higher thermal conductivity than the resin portion. Such a configuration enhances the heat dissipation properties in dissipating the heat generated in the electrode to the heatsink without impairing the bonding properties between the electrode and the wire.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a cross-sectional view of a semiconductor device according to a third preferred embodiment, corresponding to FIG. 1; and FIG. 9 is a cross-sectional view of the semiconductor device according to the third preferred embodiment, corresponding to FIG. 4.

DESCRIPTION OF THE PREFERRED EMBODIMENTS

First Preferred Embodiment

Figure 1:
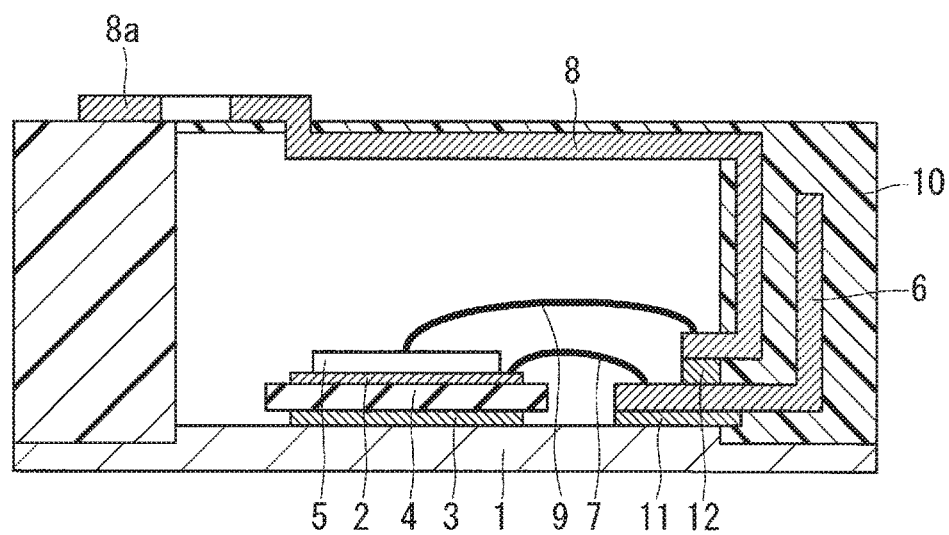
FIG. 1 is a cross-sectional view of portions of a semiconductor device according to a first preferred embodiment, in which wires are not connected.
Figure 2:
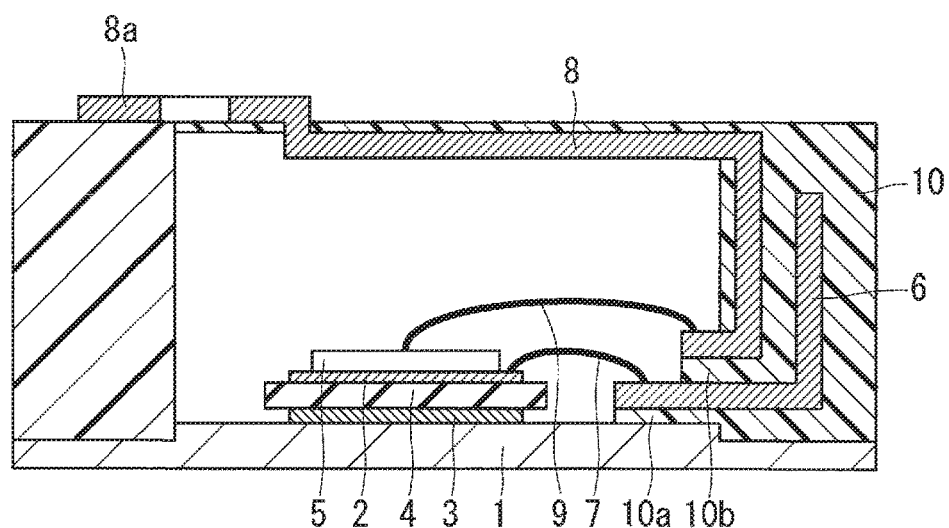
FIG. 2 is a cross-sectional view of portions of the semiconductor device according to the first preferred embodiment, in which the wires are connected.
Figure 3:
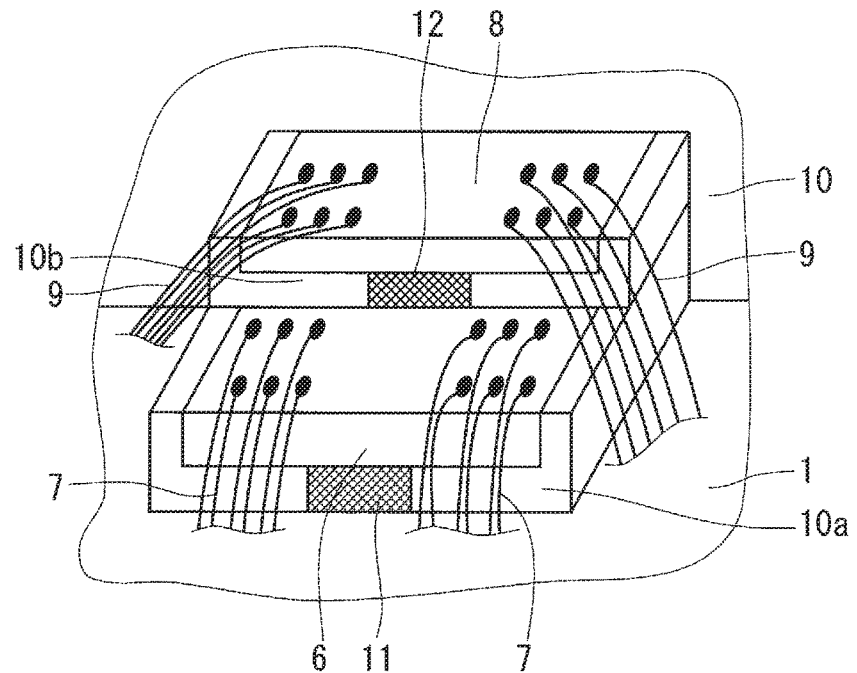
FIG. 3 is a perspective view of portions of electrodes of the semiconductor device according to the first preferred embodiment, within an inner region defined by a case.

The following describes a first preferred embodiment of the present invention with reference to the drawings. FIG. 1 is a cross-sectional view of portions of a semiconductor device according to the first preferred embodiment, in which wires 7 and 9 are not connected. FIG. 2 is a cross-sectional view of portions of the semiconductor device, in which the wires 7 and 9 are connected. FIG. 3 is a perspective view of portions of electrodes 6 and 8, within an inner region defined by a case 10.

As illustrated in FIGS. 1 to 3, the semiconductor device includes a heatsink 1, an insulating substrate 4, a semiconductor element 5, the electrode 6, the electrode 8, and the case 10. The heatsink 1 is made of metal having high thermal conductivity, such as copper. The insulating substrate 4 is disposed above the upper surface of the heatsink 1. The insulating substrate 4 includes a current circuit pattern 2 and a current circuit pattern 3 respectively disposed on its upper surface and its lower surface. The insulating substrate 4 also includes the semiconductor element 5, such as a current switching element, above its upper surface with the current circuit pattern 2 interposed between the insulating substrate 4 and the semiconductor element 5.

The case 10 made of resin is bonded to the perimeter of the upper surface of the heatsink 1, and encloses an upper-surface side of the heatsink 1, the insulating substrate 4, and the semiconductor element 5. The case 10 is also filled with a silicone gel (not shown) for instance.

The electrodes 6 and 8 are included in the case 10. The electrode 8 includes a terminal 8a that is an electrical-connection portion electrically connected to the outside. Likewise, the electrode 6 includes a terminal (not shown in FIGS. 1 and 2) that is an electrical-connection portion electrically connected to the outside. The electrode 8 includes a portion within an inner region defined by the case 10, and is electrically connected to an upper electrode (not shown) of the semiconductor element 5 in part of one surface, i.e., the upper surface of this portion through the wires 9.

The electrode 6 includes a portion within the inner region defined by the case 10, and is electrically connected to the current circuit pattern 2 in part of one surface, i.e., the upper surface of this portion, through the wires 7. Here, the current circuit pattern 2 is connected to a lower electrode (not shown) of the semiconductor element 5. In other words, the electrode 6 is electrically connected to the semiconductor element 5 in part of the upper surface of the portion within the inner region defined by the case 10 through the wires 7.

Here, the portions of the electrodes 6 and 8, within the inner region defined by the case 10 are the ends of horizontal portions of the electrodes 6 and 8, opposite to the terminal 8a (hereinafter simply referred to as "horizontal portions"). In FIGS. 1 to 3, the wires 7 and the wires 9 are each connected to the front parts and rear parts of the upper surfaces of the portions of the electrodes 6 and 8, within the inner region defined by the case 10. In FIGS. 1 to 3, the wires 7 and the wires 9 each are not connected to the middle parts of these portions.

As illustrated in FIGS. 2 and 3, in the portion of the electrode 8 within the inner region defined by the case 10, at the other surface, i.e., the lower surface with respect to a position in which the wires 9 are connected, a resin portion 10b is provided, the resin portion 10b extending from an inner wall of the case 10 to the upper-surface side of the heatsink 1. As illustrated in FIGS. 1 and 3, in the portion of the electrode 8 within the inner region defined by the case 10, at the lower surface with respect to a position in which the wires 9 are not connected, a heat conductor 12 is provided, the heat conductor 12 having higher thermal conductivity than the resin portion 10b.

As illustrated in FIGS. 2 and 3, in the portion of the electrode 6 within the inner region defined by the case 10, at the other surface, i.e., the lower surface with respect to a position in which the wires 7 are connected, a resin portion 10a is provided, the resin portion 10a extending from the inner wall of the case 10 to the upper-surface side of the heatsink 1. As illustrated in FIGS. 1 and 3, in the portion of the electrode 6 within the inner region defined by the case 10, at the lower surface with respect to a position in which the wires 7 are not connected, a heat conductor 11 is provided, the heat conductor 11 having higher thermal conductivity than the resin portion 10a. As illustrated in FIG. 1, the portion of the electrode 6 within the inner region defined by the case 10 is longer than the portion of the electrode 8 within the inner region defined by the case 10. Additionally, the heat conductor 11 is partially embedded in the case 10.

The following describes an effect of the semiconductor device according to the first preferred embodiment. A conventional semiconductor device is structured such that heat conductors are disposed all over the lower surface of portions of electrodes within an inner region defined by a case. Unfortunately, if the rigidness of the heat conductors, which is indicated by a Young's modulus and a modulus of lateral elasticity, is lower than that of the case, vibrations do not propagate to the electrodes successfully in ultrasonic bonding of wires, thus resulting in impairment of bonding properties between the electrodes and the wires.

In contrast to the conventional semiconductor device, the semiconductor device according to the first preferred embodiment is configured such that in the portions of the electrodes 6 and 8 within the inner region defined by the case 10, at the lower surfaces with respect to the positions in which the wires 7 and 9 are not connected, the heat conductors 11 and 12 are provided, the heat conductors 11 and 12 having the higher thermal conductivity than the resin portions 10a and 10b. Such a configuration enhances heat dissipation properties in dissipating heat generated in the electrodes 6 and 8 to the heatsink 1. The semiconductor device according to the first preferred embodiment is also configured such that in the portions of the electrodes 6 and 8 within the inner region defined by the case, at the lower surfaces with respect to the positions in which the wires 7 and 9 are connected, the resin portions 10a and 10b are provided, the resin portions 10a and 10b each extending from the inner wall of the case 10 to the upper-surface side of the heatsink 1. Such a configuration enables these locations to have the same rigidness as that of the case. Consequently, the vibrations easily propagate to the electrodes in ultrasonic bonding of the wires, to thus minimize impairment of the bonding properties between the electrodes 6 and 8, and the wires 7 and 9.

As a result, the heat dissipation properties are enhanced in dissipating the heat generated in electrodes 6 and 8 to the heatsink 1, without impairing the bonding properties between the electrodes 6 and 8, and the wires 7 and 9. Additionally, the bonding properties between the electrodes 6 and 8, and the wires 7 and 9 are not impaired. This achieves long-term use of the semiconductor device.

Second Preferred Embodiment

Figure 4:
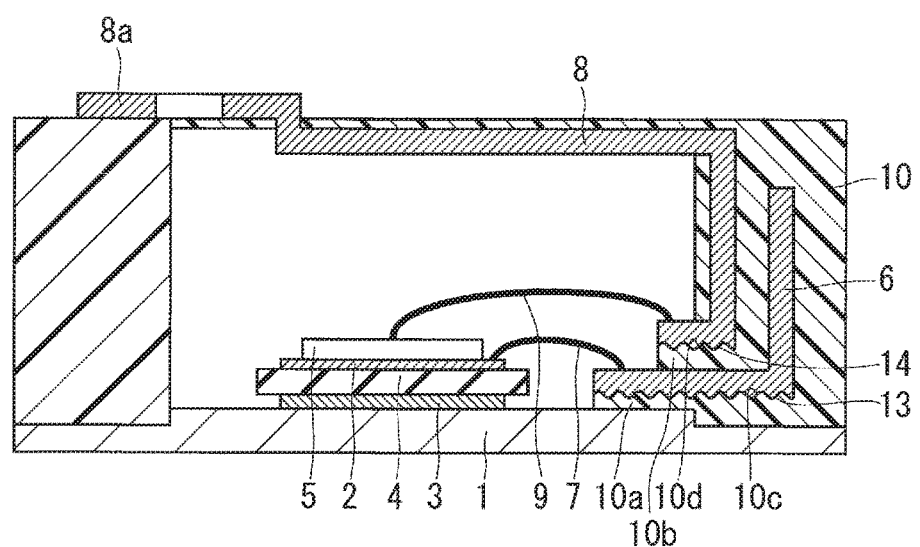
FIG. 4 is a cross-sectional view of a semiconductor device according to a second preferred embodiment.

The following describes a semiconductor device according to a second preferred embodiment. FIG. 4 is a cross-sectional view of the semiconductor device according to the second preferred embodiment. In the second preferred embodiment, the same components as those described in the first preferred embodiment are denoted by the same symbols. The description of the same components is thus not provided.

In the second preferred embodiment, at the other surfaces, i.e., the lower surfaces of the portions of the electrodes 6 and 8 within the inner region defined by the case 10, uneven coining surfaces 13 and 14 are provided. More specifically, the coining surfaces 13 and 14 are provided not only in the portions of the electrodes 6 and 8 within the inner region defined by the case 10, but also at the lower surfaces of the entire horizontal portions including the portions embedded in the case 10.

In the case 10, uneven portions 10c and 10b are provided at respective positions corresponding to the lower surfaces of the horizontal portions of the electrodes 6 and 8 including the resin portions 10a and 10b. The uneven portions 10c and 10d are respectively fitted in the coining surfaces 13 and 14.

Figure 5:
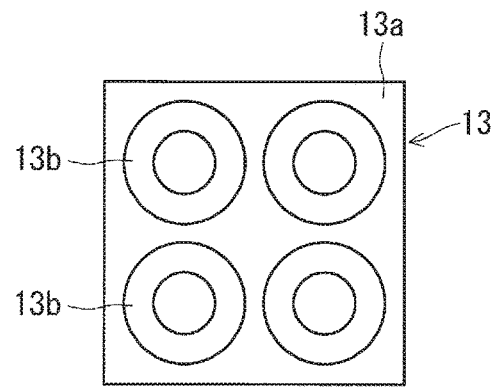
FIG. 5 is one bottom view of a coining surface in an electrode of the semiconductor device according to the second preferred embodiment.
Figure 6:
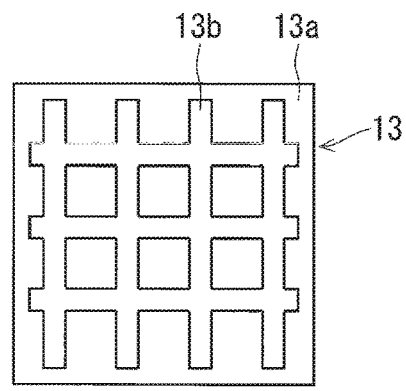
FIGS. 6 and 7 are other bottom views of the coining surface in the electrode of the semiconductor device according to the second preferred embodiment.
Figure 7:
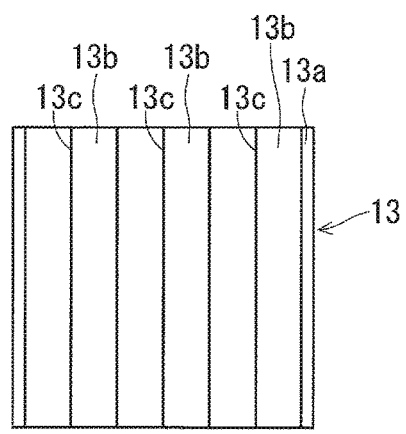

The following details the coining surfaces 13 and 14. FIG. 5 is one bottom view of the coining surface 13 of the electrode 6 of the semiconductor device according to the second preferred embodiment. FIGS. 6 and 7 are other bottom views of the coining surface 13 of the electrode 6 of the semiconductor device according to the second preferred embodiment. The coining surface 13 of the electrode 6 is substantially the same as the coining surface 14 of the electrode 8. Accordingly, provided herein is the description about the coining surface 13 of the electrode 6.

As illustrated in FIG. 5, the coining surface 13 includes a lower surface 13a of the horizontal portion of the electrode 6 and an annular protrusion 13b on the lower surface 13a. As illustrated in FIG. 6, the coining surface 13 may include the lower surface 13a of the horizontal portion and linear, two-way protrusions 13b that intersect with each other. Further, as illustrated in FIG. 7, the coining surface 13 may include the lower surface 13a of the horizontal portion and protrusions 13b that have vertexes 13c and are triangular in a side view. In FIGS. 5 to 7, the unevenness of the coining surface 13 may be reversed.

As described above, the semiconductor device according to the second preferred embodiment is configured such that the lower surfaces of the portions of the electrodes 6 and 8 within the inner region defined by the case 10 are uneven. The semiconductor device according to the second preferred embodiment is also configured such that at the lower surfaces of the portions of the electrodes 6 and 8 within the inner region defined by the case 10, the resin portions 10a and 10b are provided, the resin portions 10a and 10b each extending from the inner wall of the case 10 to the upper-surface side of the heatsink 1 and respectively having the uneven portions 10c and 10d fitted in the lower surfaces of the portions of the electrodes 6 and 8.

Such a configuration enlarges the area of contact between the portions of the electrodes 6 and 8 within the inner region defined by the case 10, and the resin portions 10a and 10b. Thus, a coefficient of heat transfer between these portions of the electrodes 6 and 8, and the resin portions 10a and 10b increases, to thus promote the heat transfer between these portions of the electrodes 6 and 8, and the resin portions 10a and 10b. Heat that transfers from the electrodes 6 and 8 is dissipated to the heatsink 1 through a contact surface and bonding surface between the case 10 and the heatsink 1. Thus, heat dissipation properties for the electrodes 6 and 8 are enhanced. Additionally, the heat conductors 11 and 12 are not provided at the lower surfaces of the electrodes 6 and 8 within the inner region defined by the case 10. Such a configuration does not affect bonding properties between the electrodes 6 and 8 and the wires 7 and 9. This enhances the heat dissipation properties in dissipating the heat generated in the electrode 6 and 8 to the heatsink 1 without impairing the bonding properties between the electrodes 6 and 8, and the wires 7 and 9.

In particular, thermal design of the semiconductor device in its entirety is easy when the electrodes 6 and 8 are main electrodes whose quantities of heat generation are greater than those of other terminals such as pin terminals.

Like in the first preferred embodiment, the semiconductor device may be configured such that in the portions of the electrodes 6 and 8 within the inner region defined by the case 10, at the lower surfaces with respect to the positions in which the wires 7 and 9 are not connected, the heat conductors 11 and 12 are provided. Providing the individual heat conductors 11 and 12 with uneven portions fitted in the coining surfaces 13 and 14 achieves this structure. In this case, the heat dissipation properties in dissipating the heat generated in the electrodes 6 and 8 to the heatsink 1 is enhanced without impairing the bonding properties between the electrodes 6 and 8, and the wires 7 and 9, like the above case.

Third Preferred Embodiment

The following describes a semiconductor device according to a third preferred embodiment. FIG. 8 is a cross-sectional view of the semiconductor device according to the third preferred embodiment, corresponding to FIG. 1. FIG. 9 is a cross-sectional view of the semiconductor device according to the third preferred embodiment, corresponding to FIG. 4. In the third preferred embodiment, the same components as those described in the first and second preferred embodiments are denoted by the same symbols. The description of the same components is thus not provided.

As illustrated in FIGS. 8 and 9, the semiconductor device according to the third preferred embodiment includes an insulating substrate 15 whose lower part includes a heat dissipation portion 15a, in place of the heatsink 1 and insulating substrate 4 described in the first and second preferred embodiments. The insulating substrate 15 is an integrated insulating substrate, and includes a heat dissipation portion 15a in its lower part and an insulating portion 15b in its upper part. The current circuit pattern 2 is disposed on the upper surface of the insulating portion 15b. The insulating substrate 15 is made of an insulating material with high heat-dissipation properties. More specifically, the insulating substrate 15 is made of a material with high thermal conductivity, such as resin or ceramic. FIG. 8 illustrates the semiconductor device according to the first preferred embodiment with the insulating substrate 15 being provided. FIG. 9 illustrates the semiconductor device according to the second preferred embodiment with the insulating substrate 15 being provided.

As described above, the semiconductor device according to the third preferred embodiment includes the insulating substrate 15 whose lower part includes the heat dissipation portion 15a, in place of the heatsink 1 and the insulating substrate 4. Consequently, preparing insulating substrates 15 with combinations of various heat dissipation portions 15a and various insulating portions 15b enables an optimal insulating substrate 15 to be selected in conformance with the size of the semiconductor element 5 and with necessary heat dissipation properties. This provides a wide range of design of the size and heat dissipation properties of the semiconductor element 5.

It is to be noted that in the present invention, the individual preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a heatsink;
   an insulating substrate disposed above said heatsink;
   a semiconductor element disposed above said insulating substrate;
   a case made of resin, said case enclosing an upper-surface side of said heatsink, said insulating substrate, and said semiconductor element; and an electrode including a portion within an inner region defined by said case, said electrode being electrically connected to said semiconductor element at one surface of said portion through a wire, wherein in said portion of said electrode within said inner region defined by said case, at another surface with respect to a position in which said wire is connected, a resin portion is provided, said resin portion extending from an inner wall of said case to said upper-surface side of said heatsink and from an end of said electrode within said inner region defined by said case towards said inner wall of said case, and wherein in said portion of said electrode within said inner region defined by said case, at another surface with respect to a position in which said wire is not connected, a heat conductor is provided in direct contact with said electrode, said heat conductor having higher thermal conductivity than said resin portion.

2. A semiconductor device comprising:

a heatsink;

an insulating substrate disposed above said heatsink;

a semiconductor element disposed above said insulating substrate;

a case made of resin, said case enclosing an upper-surface side of said heatsink, said insulating substrate, and said semiconductor element; and an electrode including a portion within an inner region defined by said case, said electrode being electrically connected to said semiconductor element at one surface of said portion through a wire, wherein another surface of said portion of said electrode within said inner region defined by said case is an uneven surface having a predetermined pattern that includes an annular protrusion or recess, linear two-way protrusions or recesses that intersect with each other, or protrusions or recesses that have vertexes and are triangular in a side view, and wherein at said uneven surface, a resin portion is provided, said resin portion extending from an inner wall of said case to said upper-surface side of said heatsink and having an uneven portion fitted in said uneven surface.

3. The semiconductor device according to claim 2, wherein said electrode comprises a main electrode.

4. A semiconductor device comprising:

an insulating substrate whose lower part has a heat dissipation portion;

a semiconductor element disposed above said insulating substrate;

a case made of resin, said case enclosing an upper-surface side of said insulating substrate and said semiconductor element; and an electrode including a portion within an inner region defined by said case, said electrode being electrically connected to said semiconductor element at one surface of said portion through a wire, wherein in said portion of said electrode within said inner region defined by said case, at another surface with respect to a position in which said wire is connected, a resin portion is provided, said resin portion extending from an inner wall of said case to said upper-surface side of said insulating substrate and from an end of said electrode within said inner region defined by said case towards said inner wall of said case, and wherein in said portion of said electrode within said inner region defined by said case, at another surface with respect to a position in which said wire is not connected, a heat conductor is provided in direct contact with said electrode, said heat conductor having higher thermal conductivity than said resin portion.

5. A semiconductor device comprising:

an insulating substrate whose lower part has a heat dissipation portion;

a semiconductor element disposed above said insulating substrate;

a case made of resin, said case enclosing an upper-surface side of said insulating substrate and said semiconductor element; and an electrode including a portion within an inner region defined by said case, said electrode being electrically connected to said semiconductor element at one surface of said portion through a wire, wherein another surface of said portion of said electrode within said inner region defined by said case is an uneven surface having a predetermined pattern that includes an annular protrusion or recess, linear two-way protrusions or recesses that intersect with each other, or protrusions or recesses that have vertexes and are triangular in a side view, and wherein at said uneven surface, a resin portion is provided, said resin portion extending from an inner wall of said case to said upper-surface side of said insulating substrate and having an uneven portion fitted in said uneven surface.

* * * * *